United States Patent [19]
Tai et al.

[11] Patent Number: 5,249,154
[45] Date of Patent: Sep. 28, 1993

[54] DATA ACCESS CONTROLLER AND METHOD

[75] Inventors: Jy-Der Tai, Plano; Morris D. Ward, Garland, both of Tex.

[73] Assignee: Texas Instruments Incorporated, Dallas, Tex.

[21] Appl. No.: 966,122

[22] Filed: Oct. 22, 1992

Related U.S. Application Data

[63] Continuation of Ser. No. 442,100, Nov. 28, 1989, abandoned.

[51] Int. Cl.$^5$ .............................. G11C 7/00
[52] U.S. Cl. ............................ 365/221; 365/230.01
[58] Field of Search ................ 365/78, 221, 230.01

[56] References Cited

U.S. PATENT DOCUMENTS

| | | | |
|---|---|---|---|
| 4,151,609 | 4/1979 | Moss | 365/221 |
| 4,694,426 | 9/1987 | Mason | 365/78 |
| 4,864,543 | 9/1989 | Ward et al. | 365/221 |
| 4,891,788 | 1/1990 | Kreifels | 365/221 X |

FOREIGN PATENT DOCUMENTS 0272869 6/1988 European Pat. Off. .
2232797 12/1990 United Kingdom .

OTHER PUBLICATIONS

Texas Instruments MOS Memory Data Book, 1989, pp. 9-87 to 9-91, as attached.

*Primary Examiner*—Joseph A. Popek
*Attorney, Agent, or Firm*—W. James Brady, III; B. Peter Barndt; Richard L. Donaldson

[57] ABSTRACT

A data access controller (10) is comprised of a control circuit (12) and an output data latch (14). The control circuit (12) receives a READ and WRITE signal (30,32) and produces a plurality of control signals (22). The output data latch (14) allows either incoming data (24) or data from a memory (16) to be propagated to the output for data access depending on the state of the control signals. The data access controller (10) enables faster data access of first in, first out memory structures.

41 Claims, 2 Drawing Sheets

DATA ACCESS CONTROLLER AND METHOD

This application is a division of application Ser. No. 07/442,100, filed Nov. 28, 1989, now abandoned.

TECHNICAL FIELD OF THE INVENTION

This invention relates generally to the field of digital logic circuits, and more particularly to a circuit and method for controlling data access from a primary storage device.

BACKGROUND OF THE INVENTION

In a computer system, memory access is one of the most vital, yet time consuming operations the CPU (Central Processing Unit) must perform to accomplish its functions. As a result, many memory access schemes have been developed along with improvements in memory device technology to shorten memory access time.

Data access time problems also exist in accessing static memory structures such as a queue or FIFO (first in, first out). When the FIFO is not empty and contains data, an actual memory access is performed to retrieve data and the data is made available by placing it on a system bus. On the other hand, when the FIFO is empty, data is not retrieved until a piece of data has been written.

Previously, when the FIFO is empty, the read operation is inhibited by gating the READ signal with a FIFO empty signal until a write has been performed. In order to ensure that the READ signal has not expired prior to the arrival of the WRITE signal or has a long enough duration after the WRITE signal, the pulse width of the READ signal and its timing in relation to the WRITE signal are required to meet certain predetermined specifications. In general, the need for these specified timing considerations substantially delays the read operation even in excess of an actual memory access operation. Accordingly, it is desirable to provide a fast data access when the FIFO is empty.

In certain circuit applications, a simultaneous write and read memory operation may be desired. Due to the particular structure of the CMOS (Complementary Metal Oxide Semiconductor) technology, a memory cell may not be written and read simultaneously. Accordingly, a need has arisen to advantageously emulate a simultaneous read and write operation to the same memory cell, which allows a read operation to access the data item during the same clock cycle as when it is being written into a FIFO.

The present invention provides for faster memory access from a static memory structure such as a FIFO. The present invention is also applicable to stacks or LIFOs (last in, first out), and is directed to overcoming one or more of the problems as set forth above.

SUMMARY OF THE INVENTION

In accordance with the present invention, a data access controller is provided which substantially eliminates or reduces disadvantages and problems associated with prior memory devices.

In one aspect of the present invention, a data access controller is provided. A store data signal and an access data signal are provided to the data access controller. A plurality of control signals are produced from the store data and access data signals. An output data circuit is arranged to receive incoming data, data from a memory device, and at least one of the plurality of control signals. The output data circuit allows one of the incoming data and data from the memory device to flow through as output data in response to the control signals received by the data circuit.

In another aspect of the present invention, a data access controller comprises a control circuit that receives status flags indicative of the number of occurrences of the WRITE and READ signals. An output data circuit receives incoming data and data from a memory device, allowing the propagation of one of the above data to the output in response to the status flags. The incoming data is allowed to propagate to the output of the output data circuit in response to the number of occurrences of the READ and WRITE signals being equal, or the number of occurrences of the WRITE signal exceeding the READ signal by one. The data from the memory device is allowed to propagate to the output in response to the number of occurrences of the WRITE signal exceeding the READ signal by at least two.

In yet another aspect of the present invention, a method is provided for controlling data access from a memory device. The method includes the steps of providing a READ signal and a WRITE signal, and producing a plurality of control signals therefrom. At least one of the plurality of control signals is received by a control circuit, and depending on the control signal, one of the incoming data and data from a memory device is allowed to propagate to an output in response to the control signal.

An important technical advantage of the data access controller and control method is the ability to provide faster data fall-through where fall-through time is defined as the time required for data access in an empty FIFO. In particular, the data access controller advantageously provides an elegant and simple solution in improving the data access speed of a FIFO or LIFO data structure.

Another technical advantage of the present invention includes the ability to effectively read and write data simultaneously to and from a FIFO or LIFO memory structure.

BRIEF DESCRIPTION OF THE DRAWINGS

For a better understanding of the present invention, reference may be made to the accompanying drawings, in which.

DETAILED DESCRIPTION OF THE INVENTION

Figure 1:
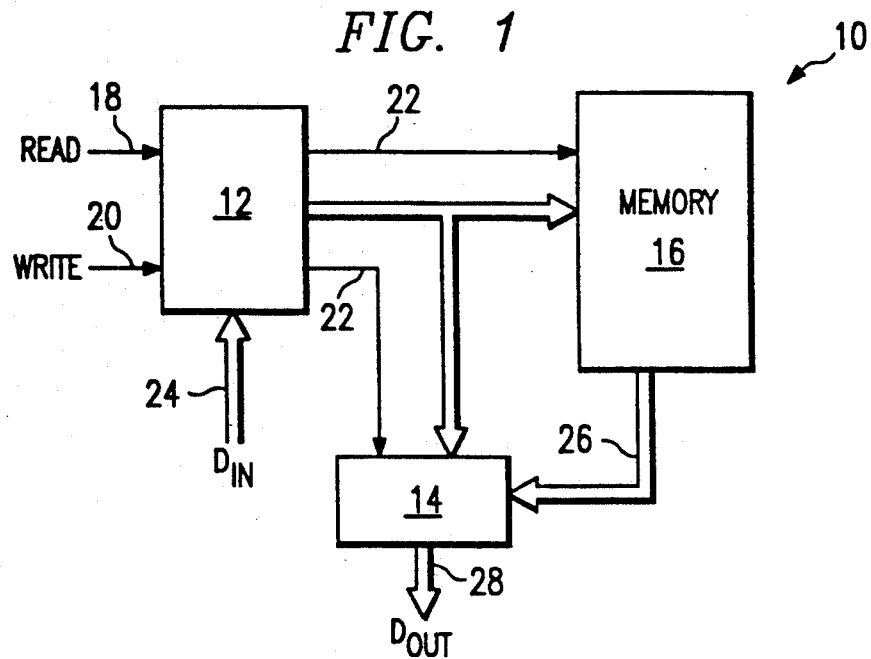
FIG. 1 is a simplified block diagram of the instant invention.

In reference to the drawings, FIG. 1 illustrates a block diagram of a data access controller, indicated generally at 10, constructed according to the teaching of the present invention. In FIG. 1, data access controller 10 is composed of a control circuit 12 and an output data latch 14, both coupled to a memory 16. The memory 16 is representative of static memory devices that allow data to be written and read. In the preferred embodiment of the instant invention, memory 16 is configured generally as a FIFO memory structure which only allows data to be read in the order that they are written.

The control circuit 12 receives access data and store data signals shown as a READ signal 18 and a WRITE signal 20, which indicate that data is to be accessed and stored, respectively. The READ and WRITE signals 18, 20 may be conventionally generated externally by a microprocessor unit (not shown). A plurality of control signals 22 are generated by control circuit 12 from the READ and WRITE signals 18, 20 and are received by both memory 16 and output data latch 14. Externally provided incoming data $D_{IN}$ 24 is received directly by both output latch 14 and memory 16. Further, data which has been stored in memory 16 is also accessible by output data latch 14 through data path 26. Therefore, $D_{IN}$ 24 may bypass memory 16 by passing through output data latch 14 and be propagated as output data $D_{OUT}$ 28 in response to selected control signals 22 from control circuit 12. This bypass feature permits direct access to data from data latch 14 without the need to disturb or interact with memory 16. Accordingly, valuable CPU time is save thereby, giving rise to more efficient overall processor operations.

Figure 2:
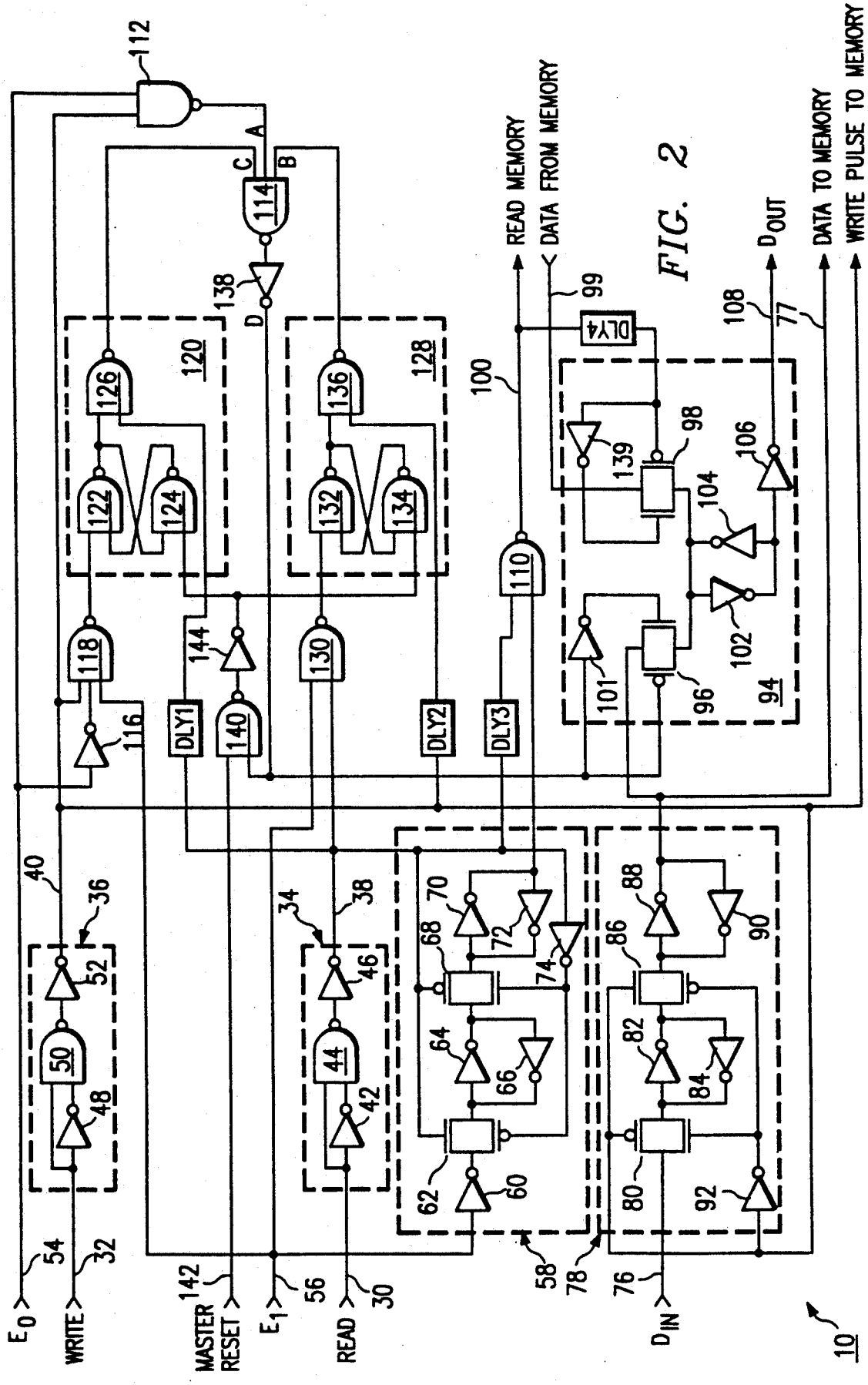
FIG. 2 is a detailed schematic of the preferred embodiment of the instant invention.

FIG. 2 illustrates a schematic diagram of one particular embodiment of the invention described in FIG. 1. The externally produced READ and WRITE signals 30 and 32 are supplied to data access controller 10. The READ and WRITE signals 30 and 32 are received by first and second edge-detectors 34 and 36, respectively. In the instant embodiment of the present invention, the rising edges of the READ and WRITE signals 30 and 32 are detected by first and second edge-detectors 34 and 36, and a positive READ pulse 38 or a positive WRITE pulse 40, respectively, are produced. The READ signal edge-detector 34 comprises an inverter 42 having its output coupled to one input of a two input NAND gate 44. The output of NAND gate 44 is coupled to the input of another inverter 46. The READ signal 30 is received at the input of inverter 42 and also at one input of NAND gate 44. The READ pulse 38 is generated at the output of inverter 46.

The WRITE signal edge-detector 36 is constructed in like manner as READ signal edge-detector 34, comprising an inverter 48, a two input NAND gate 50 and another inverter 52. The output of inverter 48 is connected to one input of NAND gate 50. The output of NAND gate 50 is connected to the input of inverter 52. The WRITE signal 32 is received at both the input of inverter 48 and the other input of NAND gate 50, and the WRITE pulse 40 is generated at the output of inverter 52. The READ and WRITE pulses 38 and 40 at the output of first and second edge-detectors 34 and 36 are used to produce various control signals.

An $E_0$ signal 54 is shown as an input to data access controller 10 in FIG. 2. $E_0$ is a signal which is active when the number of write operations is equal to the number of read operations. Thus, the $E_0$ signal 54 is active when memory 16 is empty, that is, when all of its stored contents are read. The $E_0$ signal 54 is inactive when memory 16 contains one or more data items. In the present embodiment, $E_0$ is configured to be "high" when active.

Another signal shown as an input to the data access controller 10 is the $E_1$ signal 56. $E_1$ is a signal that is active when the number of write operations is equal to the number of read operations or when the number of write operations exceeds the number of read operations by one. Thus, the $E_1$ signal 56 is active when memory 16 is either empty or contains only one unread data item. In the present embodiment, the $E_1$ signal 56 is also configured to be "high" when active.

In the preferred embodiment, a FIFO flag generation circuit (not shown) generates the $E_0$ and $E_1$ signals by keeping count of the number of read and write operations that have been performed and by comparing the counts for both signals. The generation of the $E_0$ and $E_1$ signals 54, 56 may be accomplished by conventional counter circuits, comparators and the like.

It is important to note that while the present invention has been described in connection with particular choices of the active edges and/or levels, one skilled in the art will appreciate that the invention is not necessarily so limited and that alternate active edges and levels thereof are applicable.

The $E_1$ signal 56 is latched by a latching circuit 58. Latch 58 is constructed from a number of buffers and CMOS transmission gates. The $E_1$ signal 56 is inverted by an inverter 60 coupled to a CMOS transmission gate 62. Transmission gate 62 is then coupled in series to a pair of buffer inverters 64 and 66 and to another CMOS transmission gate 68. The output of transmission gate 62 is connected to the input of inverter 64 and the output of inverter 66. The output of inverter 64 is connected to the input of CMOS transmission gate 68. The output from transmission gate 68 is connected to another pair of inverters 70 and 72, where the output of transmission gate 68 is connected to the input of inverter 70 and the output of inverter 72. The output of inverter 70 is connected to the input of inverter 72. The CMOS transmission gates 62 and 68 of latch 58 are controlled by the READ pulse 38. The READ pulse 38 is received at the nMOS gate of transmission gate 62 and the pMOS gate of transmission gate 68. The inverted READ pulse, inverted by an inverter 74, is received at the pMOS gate of transmission gate 62 and the nMOS gate of transmission gate 68.

It can be appreciated that the latch structure described above represents one embodiment of the present invention, and that alternate versions of data latches are also applicable. In addition, the combination of edge-detector 34 and latch 58 gives rise to a function like that of an edge sensitive data flip-flop. Consequently, alternative embodiments may incorporate data flip-flops rather than the latching circuit 58 shown in FIG. 2.

$D_{IN}$ 76 to be stored into the memory 16 is received and latched by another latching circuit 78. The latch 78 is constructed in the same fashion as latch 58, and has a CMOS transmission gate 80 connected in series to a pair of inverters 82 and 84 and then to another CMOS transmission gate 86 and another pair of inverters 88 and 90. Incoming data $D_{IN}$ 76 is received at the input of transmission gate 80. The output of transmission gate 80 is connected to the input of inverter 82 and the output of inverter 84. The output of inverter 82 is also connected to the input of transmission gate 86. The output of transmission gate 86 is connected to the input of inverter 88 and the output of inverter 90. The latch 78 is controlled by the WRITE pulse 40.

In the present embodiment of the instant invention, the WRITE pulse 40, being "low" while inactive, enables the pMOS gate of transmission gate 80, and also enables the nMOS gate of transmission gate 80 through an inverter 92. Configured in this manner, $D_{IN}$ 76 is latched into latch 78 as soon as a rising edge of the WRITE signal 32 (or a positive going WRITE pulse 40) is available. The WRITE pulse 40 and its inverse is also supplied to the nMOS and pMOS gates respectively of transmission gate 86 to allow the latched $D_{IN}$ 76 to pass to an output data latch 94. The output of latch 78 is also coupled to the memory 16 by a bus 77 so that the data may be written to the memory 16. In addition, the WRITE pulse 40 is also provided to memory 16 as a control signal to write the data on bus 77.

The READ and WRITE pulses 38 and 40 and the memory status signals $E_0$ and $E_1$ 54 and 56 are supplied to a number of logic gates and latches to generate control signals to operate and enable the output data latch 94. The output data latch 94 includes a CMOS transmission gate 96 which accepts latched incoming data 76 from the output of inverter 88 of latch 78. A second CMOS transmission gate 98 accepts data from memory 99 and is enabled by a READ MEMORY signal 100. The READ MEMORY signal 100 and its inverted signal generated by inverter 139 are received by the pMOS and nMOS gates of transmission gate 98, respectively. The output data latch 94 further comprises a buffer including a pair of inverters 102 and 104 to receive the data from transmission gate 96 or transmission gate 98. The input of inverter 102 is connected to the output of transmission gates 96 and 98 and the output of inverter 104. The output of inverter 102 is connected to the input of inverter 104 and further to the input of an inverter 106. The output data 108 from the output of inverter 106 may be supplied to the microprocessor through a system bus (not shown).

The READ MEMORY signal 100 for controlling transmission gate 98 is a function of the READ pulse 38 and the output of latch 58. These two signals are supplied to the input of a NAND gate 110 to generate the READ MEMORY signal 100. It is apparent from FIG. 2 that the output data latch 94 passes either $D_{IN}$ 76 or the data from memory 99 depending on the status of the READ MEMORY signal 100 and another control signal, the generation of which is discussed in detail below.

A NAND gate 112 receives the $E_0$ signal and the write pulse 40 at its input and produces a signal designated as A. The output of NAND gate 112 is connected to one input of a NAND gate 114 to transmit signal A thereto.

The $E_0$ signal 54 is provided at the input of an inverter 116, producing an inverted $E_0$ signal which is provided at the input of a three input NAND gate 118. Two other signals, the WRITE pulse 40 and the E signal 56, are provided at the other inputs of the NAND gate 118. The output of NAND gate 118 is connected to the input of a latch 120. The latch 120 is composed of two NAND gates 122 and 124 joined in a manner to construct a level sensitive set-reset latch. The output of NAND gate 118 is connected to one input of NAND gate 122. The output of NAND gate 122 is connected to one input of NAND gate 124. The output of NAND gate 124 is connected to the other input of NAND gate 122. The output of NAND gate 122 is further connected to one input of another NAND gate 126 along with the READ pulse 38 provided at the other input. NAND gate 126 generates a signal designated as C. The READ pulse 38 acts like an enable signal to allow the signal C to become available at the output of latch 120 and the input of a NAND gate 114.

The third input to NAND gate 114 is a signal B provided by a latch circuit 128. Constructed in the same manner as latch 120, latch circuit 128 receives input from a NAND gate 130, which has READ pulse 38 and the $E_1$ signal 56 as input. The output of NAND gate 130 is provided as input to a pair of NAND gates 132 and 134 arranged like NAND gates 122 and 124. The output of NAND gate 132 is connected to the input of NAND gate 134. The output of NAND gate 134 is connected to the other input of NAND gate 132. The output of NAND gate 132 is also connected to one input of a NAND gate 136 The NAND gate 136 also receives the WRITE pulse 40 at the other input to produce the B signal. The output of NAND gate 136 is connected to an input of NAND gate 114. The WRITE pulse 40 acts as an enable signal to allow the signal B to become available at the input of the three input NAND gate 114.

The output of NAND gate 114 is connected to the input of an inverter 138. Thus, the NAND gate 114 generates a NAND function of signals A, B and C, which is then inverted to produce a signal designated as D at the output of inverter 138.

The output of inverter 138 is connected to the pMOS gate of transmission gate 96, and is further coupled to the nMOS gate thereof through an inverter 101. Accordingly, signal D is an enable signal supplied to the transmission gate 96 of the output data latch 94 to allow the transmission of $D_{IN}$ 76 to the output $D_{OUT}$ 108. Thus, incoming data, $D_{IN}$, from the latch 78 is allowed to pass through transmission gate 96 when the signal D is "low," or whenever one of A, B or C is "low." The significance of the A, B, C and D signals is discussed below in connection with FIG. 3.

Signal D is further provided as a reset signal to reset the latches 120, 128. Signal D is received at one input of a two input NAND gate 140 along with an externally provided MASTER RESET signal 142 at the other input. The output of the NAND gate 140 is connected to the input of an inverter 144, the output of which is connected to the input of both NAND gates 124 and 134 of latches 120 and 128, respectively. The MASTER RESET signal 142 may be provided by the microprocessor when a reset of the latches 120 and 128 is desired. It is apparent that by resetting the latches 120 and 128, the data access controller 10 is also effectively reset.

Delay circuits DLY1, DLY2, DLY3 and DLY4 are shown in FIG. 2, and used to provide timing synchronization between various signals. DLY1 delays READ pulse 38 before it is received by NAND gate 126 to allow WRITE pulse 40 to have sufficient time to set the latch structure made of NAND gates 122 and 24. In a similar fashion, DLY2 delays WRITE pulse 40 before it is received by NAND gate 136 to allow READ pulse 38 and E to have sufficient time to set NAND gates 132 and 134. DLY3 delays READ pulse 38 before it is received by NAND gate 110 so that the other input of NAND gate 110 from latch 58 may be received at substantially the same time. Finally, DLY4 provides a delay on the READ MEMORY signal 100 before it is received by latch 94 to allow the time necessary for memory access to retrieve DATA FROM MEMORY 99. DLY1, DLY2, DLY3 and DLY4 may be implemented by circuits such as a series of inverters and the like. The amount of delay time for each delay circuit may be appreciated upon inspection of FIGS. 2 and 3 and implemented without undue experimentation.

It can be appreciated that the present invention is not limited in scope to the circuit implementation described and shown herein. In particular, alternative embodiments may include circuit implementations derivable from the present embodiment by De Morgan's theorem as known in the art of Boolean logic. For example, a NAND gate such as NAND gate 140 may be equally implemented by an OR gate with all of the input signals inverted. Furthermore, the combination of a NAND gate and an inverter give rise to an AND function, as known in the art.

It should be understood that the circuit shown in FIG. 2 is operable to read and write a single bit of data. This circuit may therefore be useful in a serial application. However, in an alternative implementation the data may generally be more than one bit requiring parallel latches and multiple bit buses where data latching and data transfer is concerned. Accordingly, latch 78 and output latch 94 may be expanded to accommodate all bits of data and may be interconnected by a data bus. The incoming data, data from memory and data to memory may also be transferred on buses connected to a system bus and to the memory, respectively.

Figure 3:
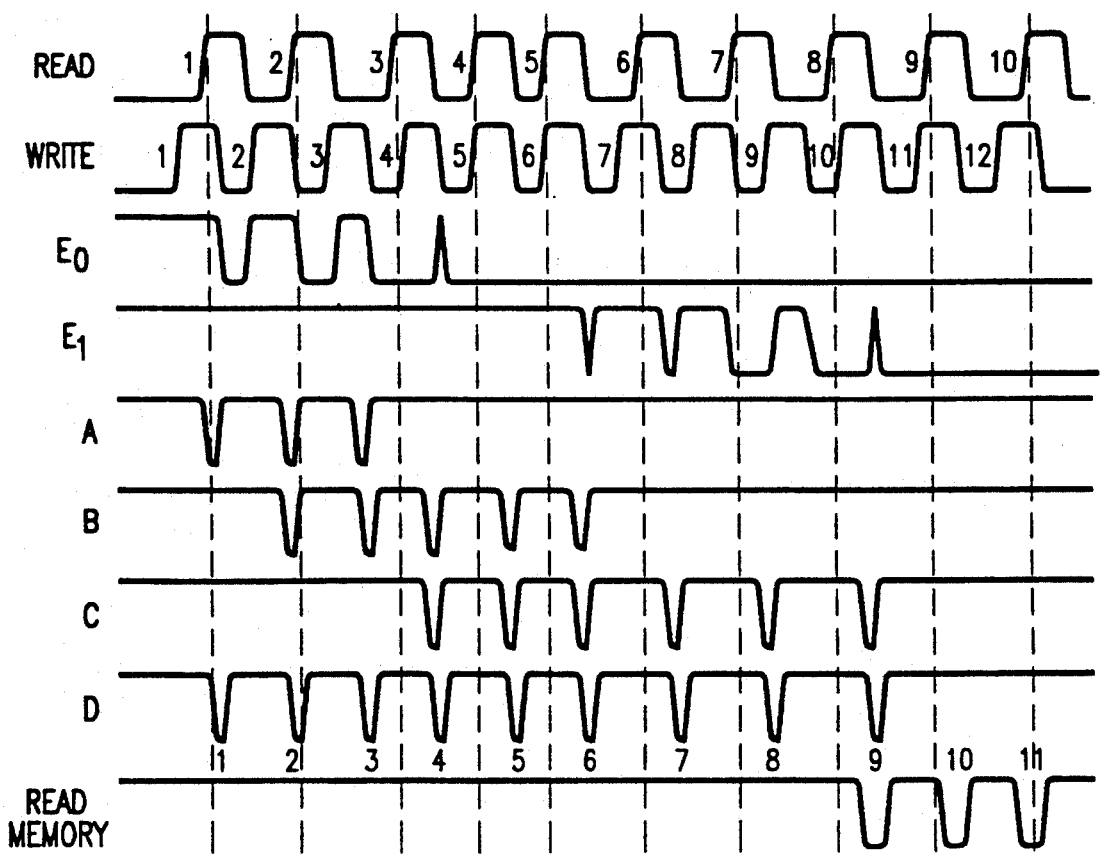
FIG. 3 illustrates the timing and waveform of control signals in the preferred embodiment of the present invention.

Referring now to FIG. 3 along with FIG. 2, the operation of the data access controller 10 and the timing therein are as follows. FIG. 3 illustrates the timing waveforms of the READ signal 30, the WRITE signal 32, the $E_0$ signal 54 and the E signal 56. Solely for the purpose of illustrating the operations of data access controller 10, READ and WRITE signals 30 and 32 are shown to be periodic with fixed frequencies. It is to be understood, however, that READ and WRITE signals 30 and 32 are independent, one from the other, and may not be periodic. In addition, timing waveforms of various points of interest within the data access controller 10 are also shown in FIG. 3. Included are signals A, B, C, D and READ MEMORY signal 100. The A, B and C signals are the input signals to NAND gate 114 and indicate three distinct read and write timing situations. Signal A is active when memory 16 is empty during a write operation. In situation A, the data being written is allowed to fall-through to the output regardless of the timing of the read operation Signal B is active when memory 16 has one data item, and read is ahead of the corresponding write. In situation B, the WRITE pulse 40 causes the data being written to fall-through to the output. Finally, signal C is active when memory 16 has one data item, and read is behind the corresponding write. In situation C, the READ pulse 38 causes data written to fall-through to the output.

FIG. 3 also shows signal D at the output of inverter 138. In addition, READ MEMORY signal 100 is the output from NAND gate 110.

It is important to note that the purpose of the discussion herein is to discuss the timing interrelationships between the control signals, and in no way limits the timing and operations of the data access controller 10 to the waveforms illustrated in FIG. 3.

Initially, the READ and WRITE signals 30 and 32 are inactive ("low"); the $E_0$ and $E_1$ signals 54, 56 are "high," indicating an empty memory 16; and the rest of the signals A, B, C, D, and READ MEMORY signal 100 are inactive ("high"). As shown, the READ and WRITE signals 30 and 32 are generally periodic, but have differing periods. The WRITE signal 32 has a period substantially shorter than the READ signal 30. The rising edge of the WRITE signal 32 causes edge-detector 36 to produce a positive going WRITE pulse 40. Since the signal A is the "NAND" of the WRITE pulse 40 and $E_0$ signal 54, the rising edge of the WRITE signal 32 produces a negative pulse at the output of NAND gate 114. Since the signal D is essentially the "AND" of signals A, B and C, the negative pulse A causes signal D to follow in the same manner.

At the same time, the rising edge of the WRITE signal 32 causes edge-detector 36 to produce a positive going WRITE pulse 40. The positive going WRITE pulse 40 in turn enables the incoming data latch 78 and makes $D_{IN}$ 76 available to the output latch 94. The active ("low") signal D in turn enables transmission gate 96 of the output data latch 94, which allows the propagation of latched $D_{IN}$ 76 to the $D_{OUT}$ output 108 for the next read operation. Latched $D_{IN}$ 76 is also made available via bus 77 to memory 16 to be stored.

From the foregoing, it can be appreciated that a subsequent read operation may access the data already made available on the output 108 of the output data latch 94, and no memory access operation is required.

The rising edge of the WRITE signal 32 also causes the $E_0$ signal 54 to go from high to low. Note that a write operation indicates that the memory 16 is no longer empty and that a data item is available. Note also that the falling edge of the $E_0$ signal 54 is offset from the rising edge of the WRITE signal 32 due to the delay in the circuitry that generates the $E_1$ signal 54. At this point in time the $E_1$ signal 56 remains active ("high"), since $E_1$ is high when the memory 16 is either empty or has one data item.

Subsequently, the first rising edge of the READ signal 30 causes a read operation to be performed on the data item that was written to memory 16 by the first rising edge of the WRITE signal 32. Since the number of READ signal active edges 30 is then equal to the number of WRITE signal active edges 32, the memory 16 must effectively contain zero unread data items. As a result, the $E_0$ signal 54 becomes active ("high") again. The rising edge of the READ signal 30 also causes the first edge-detector 34 to produce a READ pulse 38 which is received by NAND gate 130. The other input of NAND gate 130 is the $E_1$ signal 56 which is "high" at this time. The positive going READ pulse 38 "NANDed" with the high E signal 56 generates a "zero" at the output of NAND gate 130, which causes the latch 128 to generate a logic level "one" at the output of NAND gate 132. The logic level "one" is then received at the input of NAND gate 136 along with the second WRITE pulse 40, producing a "low" signal B.

At the same time, the logic level of signal A is also "low" due to the second positive WRITE pulse 40 and the high $E_0$ signal 54 at the input of NAND gate 112. As a result, the logic level of signal D becomes "low," which enables the output data latch 94 to transmit $D_{IN}$ 76 to the output of latch 94, $D_{OUT}$ 108. Thus, when the second rising edge of the READ signal 30 is issued by the microprocessor to access the second data item, the data is already present at the output data line 108.

Like conditions remain for the third rising edge of the WRITE signal 32 in which $D_{IN}$ 76 is again passed to the output 108 of the output data latch 94. However, a transition takes place at the fourth rising edge of the WRITE signal 32. By the fourth rising edge of the WRITE signal 32, the third rising edge of the READ signal 30 is also present. The count of the rising edges of the WRITE signal now exceeds the count of the rising edges of the READ signal 30, indicating that the memory 16 contains one stored data item. The $E_0$ signal 54 is shortened to a slender pulse because of the close proximity of the READ and WRITE active edges. The shortened $E_0$ pulse is not enough to enable the NAND gate 112 to generate a "low" signal A, so signal A remains "high." The logic level of signal B becomes "low" again due to the READ pulse 38 and the "high" E₁ signal 56. In addition, at the input of the NAND gate 118, the WRITE pulse 40, the "low" E₀ signal 54 and the "high" E₁ signal 56 causes the output of NAND gate 118 to become "low." This low output from NAND gate 118 sets the output of NAND gate 122 to "high." The third READ pulse 38 enables NAND gate 126 and generates a "low" logic level for signal C. The "low" B and C signals produce a "low" signal D at the output of inverter 138, which enables the output data latch 94 to allow the transmission of incoming data D$_{IN}$ 76 to the output 108.

The active edge of the WRITE signal 32 continues to be offset from the active edge of the READ signal 30. By the sixth rising edge of the WRITE signal 32, it is occurring slightly ahead of the fifth rising edge of the READ signal 30. The slight advantage of the sixth rising edge of the WRITE pulse 32 causes the E₁ signal 56 to become "low" for a short duration, since the memory 16 contains two data items during the instant between the rising edges of the WRITE signal 32 and the READ signal 30. By the seventh write, the rising edge of the WRITE signal 32 substantially leads the sixth rising edge of the READ signal 30. The E₁ signal 56 becomes "low" for a longer duration, and the logic level of signal B remains "high." This is due to the fact that the condition required for B to be "low," i.e. both the READ signal 30 and the E signal 56 "high," is no longer satisfied. By the ninth write, the E₁ signal 56 is "low," causing the output of NAND gate 110 to become "low."The output of NAND gate 110, which is the READ MEMORY signal 100, controls memory access of the memory 16. As shown in FIG. 3, both the output data latch 94 transmission gate enable signals D and READ MEMORY 100 are active. Thus, at the ninth read, the data present at the output of the output data latch 94 is comprised of data from the second latch 78 as well as data from the memory 16, the data therein being equal.

The READ signal 30 continues to lag behind the WRITE signal 32, and by the tenth write the number of write operations is exceeding the number of read operations by two. The lagging of the READ rising edge to the WRITE rising edge by two cycles suppresses the E₁ signal 56 to become inactive ("low"). The condition required for signal C to be "low" is no longer present, which causes signal C to remain "high" for the next read operation. In the absence of active A, B and C signals, the logic level for signal D remains "high," therefore disabling the transmission of D$_{IN}$ 76 to the output of the output latch 94. As long as this condition exists, the read operation will be accessing data from the memory 16 exclusively, by enabling the transmission gate 98 of the output data latch 94 only with the READ MEMORY signal 100. Subsequent data accesses are performed like conventional memory access operations. However, once the write operations are discontinued, subsequent read operations will cause the number of data within memory 16 to decrease. When the data within memory 16 reduces to one, the data access controller will again permit access of data D$_{IN}$ via output data latch 14 without the need to access memory 16.

In view of the aforesaid, it may be appreciated that data access controller 10 of the present invention allows bypassing of memory 16 during certain memory access operations. Since memory access is one of the most time consuming operations in a computer system, valuable CPU time may be saved by the incorporation of the present invention.

Although the present invention has been described in detail, it should be understood that various changes, substitutions and alterations can be made hereto without departing from the spirit and scope of the invention as defined by the appended claims.

What is claimed is:

1. A data access controller comprising:
   a control circuit responsive to a store data signal, an access data signal, and flag status information indicative of the number of occurrences of said store data signal relative to the number of occurrences of said access data signal for producing a plurality of control signals; and
   an output data circuit arranged to receive incoming data and data from a memory device, said output data circuit operable to selectively allow flow through of said incoming data as output data and selectively allow flow through of said data from said memory device as output data in response to said control signals.

2. The data access controller, as set forth in claim 1, wherein said control circuit produces a first control signal in response to said flag status information indicating the number of access data signals is equal to the number of store data signals and said data output circuit allows said incoming data to flow through in response to said first control signal.

3. The data access controller, as set forth in claim 1, wherein said control circuit produces a first control signal in response to said flag status information indicating the number of store data signals exceeds the number of store access signals by one and said data output circuit allows said incoming data to flow through in response to said first control signal.

4. The data access controller, as set forth in claim 1, wherein said control circuit produces a first control signal in response to said flag status information indicating the number of store data signals exceeds the number of store access signals by at least two and said data output circuit allows data form said memory device to flow through in response to said first control signal.

5. The data access controller, as set forth in claim 1, wherein said flag status information includes a first signal indicative of the number of said access data signals being equal to the number of said store data signals.

6. The data access controller, as set forth in claim 1, wherein said flag status information includes a second signal indicative of the number of said store data signals being equal to or exceeding the number of said access data signals by one.

7. The data access controller, as set forth in claim 6, wherein said control circuit produces a first control signal in the presence of both said store data signal and said first signal.

8. The data access controller, as set forth in claim 7, wherein said control circuit produces a second control signal in the presence of said access data signal and said second signal, followed by the presence of said store data signal.

9. The data access controller, as set forth in claim 8, wherein said control circuit produces a third control signal in the absence of said first signal, in the presence of both said second signal and said store data signal, and followed by the presence of said access data signal.

10. The data access controller, as set forth in claim 7, in which said store data signal and said access data signal have rising and falling edges and said control circuit includes:

a first edge-detector arranged to detect one of said rising and falling edges of said store data signal, and to produce a store data pulse; and a second edge-detector arranged to detect one of said rising and falling edges of said access data signal, and to produce an access data pulse.

11. The data access controller, as set forth in claim 10, said control circuit further including:

a first logic circuit for producing an output signal in response to said store data pulse, a first state of a first signal, and a first state of a second signal, said first signal having said first state indicating the number of access data signals is not equal to the number of said store data signals or a second state indicating the number of access data signals is equal to the number of said store data signals, said second signal having said first state indicating the number of said store data signals is equal to or exceeds by one the number of said access data signals or a second state indicating the number of said store data signals exceeds by at least two the number of said access signals;

a first latch circuit for producing a first control signal in response to the output signal produced by said first logic circuit and said access data pulse;

a second logic circuit for producing an output signal in response to said access data pulse and said first state of said second signal;

a second latch circuit for producing a second control signal in response to the output signal produced by said second logic circuit and said store data pulse; and a third logic circuit for producing a third control signal in response to said store data pulse and said second state of said first signal.

12. The data access controller, as set forth in claim 11, said control circuit further including:

a third latch for receiving said second signal, said third latch enabled by said access data pulse to produce a retained second signal; and a fourth logic circuit for producing a fourth control signal in response to said access data pulse and said retained second signal having said second state.

13. The data access controller, as set forth in claim 12, further comprising an input data circuit for retaining said incoming data in response to said store data pulse.

14. The data access controller, as set forth in claim 13, wherein said output data circuit includes first and second portions, said first portion for receiving said retained incoming data and enabled by any of said first, second, and third control signals to allow flow through of said retained incoming data as output data, said second portion for receiving said data from a memory device and enabled by said fourth control signal to allow flow through of said data from a memory device as output data.

15. The data access controller, as set forth in claim 11, wherein said control circuit further includes a reset circuit for supplying a reset signal to said first and second latch circuits in response to any of said first, second, and third control signals.

16. The data access controller, as set forth in claim 1, wherein said memory device has a first-in, first-out memory structure.

17. A data access controller comprising:

a control circuit responsive to a WRITE signal, a READ signal and flag status information indicative of a comparison between the number of occurrences of each of said WRITE and READ signals and for producing a plurality of control signals in response to predetermined relationships between said READ signals, said WRITE signals, and said flag status information; and an output data circuit arranged to receive incoming data and data from a FIFO memory, said output data circuit being further arranged to receive at least one of said control signals and to propagate either said incoming data or said data from said FIFO memory to an output as output data response to said at least one control signal.

18. The data access controller, as set forth in claim 17, wherein said output data circuit propagates said incoming data to the output as output data in response to a control signal produced by said control circuit when the number of said READ and WRITE signals are equal.

19. The data access controller, as set forth in claim 17, wherein said output data circuit propagates said incoming data to the output as output data in response to a control signal produced by said control circuit when the number of said WRITE signals exceeds the number of said READ signals by one.

20. The data access controller, as set forth in claim 17, wherein said output data circuit propagates said from said FIFO to the output as output data in response to a control signal produced by said control circuit when the number of said WRITE signals exceeds the number of said READ signals by at least two.

21. The data access controller, as set forth in claim 17, wherein said control circuit receives an empty signal in response to the number of said WRITE and READ signals being equal, and further receives an empty-or-one signal in response to the number of said WRITE and READ signals being equal, or the number of said WRITE signals exceeding the number of said READ signals by one.

22. The data access controller, as set forth in claim 21, wherein said control circuit generates a first condition signal in response to the presence of both said WRITE signal and said empty signal.

23. The data access controller, as set forth in claim 22, wherein said control circuit generates a second condition signal in response to the presence of both said READ signal and said empty-or-one signal occurring just prior to said WRITE signal.

24. The data access controller, as set forth in claim 23, wherein said control circuit generates a third condition signal in response to the presence of said WRITE and empty-or-one signals along with the absence of said empty signal occurring just prior to said READ signal.

25. The data access controller, as set forth in claim 24, wherein said control circuit generates a bypass signal in the presence of any one of said first, second and third condition signals.

26. The data access controller, as set forth in claim 25, wherein said output data circuit propagates said incoming data as output data in the presence of said bypass signal.

27. The data access controller, as set forth in claim 21, wherein said control circuit produces a read-memory signal in the presence of said READ signal and the absence of said empty-or-one signal.

28. The data access controller, as set forth in claim 27, wherein said output data circuit propagates said data from said memory device in the presence of said read-memory signal.

29. The data access controller, as set forth in claim 17, wherein said data output circuit includes a data latch and a buffer.

30. A method for controlling data access in response to READ and WRITE signals, comprising the steps of:
receiving said READ and WRITE signals and at least one status signal indicative of a comparison between the number of occurrences of said READ signal and the number of occurrences of said WRITE signal and producing a plurality of control signals therefrom;
receiving incoming data and data from a memory device; and
propagating at least one of said data to an output in response to said control signals.

31. The data access controller, as set forth in claim 30, wherein said step of receiving a status signal includes receiving an empty signal that is active in response to the number of occurrences of said READ and WRITE signals being equal and inactive in response to the number of occurrences of said READ and WRITE signal being unequal.

32. The data access controller, as set forth in claim 31, wherein said step of receiving a status signal includes receiving an empty-or-one signal that is active in response to the number of occurrences of said READ and WRITE signals being equal or the number of occurrences of said WRITE signal exceeding the number of occurrences of said RAD signal by one and inactive in response to the number of occurrences of said WRITE signal exceeding the number of occurrences of said READ signal by at least two.

33. The data access controller, as set forth in claim 32, wherein said step of propagating data includes propagating said incoming data to said output in response to a control signal produced when at least one of said empty and empty-or-one signals is active.

34. The data access controller, as set forth in claim 32, wherein said step of propagating data includes propagating said data from said memory device to said output in response to a control signal produced when said empty-or-one signal is inactive.

35. The method for controlling data access, as set forth in claim 32, said WRITE signal having rising and falling edges, further comprising the steps of:
latching said incoming data at one of the rising and falling edges of said WRITE signal; and
providing said latched incoming data to an output data latch in response to said WRITE signal and said empty signal being active, in response to said READ signal and said empty-or-one signal being active, or in response to said WRITE signal, said first signal being inactive, and said second signal being active.

36. The data access controller, as set forth in claim 35, said READ signal having rising and falling edges, further comprising the steps of:
latching said empty-or-one signal at one of the rising and falling edges of said READ signal; and
propagating said data from said memory device to said output data latch in response to said READ signal and said latched empty-or-one signal being inactive.

37. The data access controller, as set forth in claim 32, said WRITE and READ signals having rising and falling edges, further comprising the steps of:
generating a first pulse at one of the rising and falling edges of said WRITE signal;
generating a second pulse at one of the rising and falling edges of said READ signal;
generating a first signal in response to said first pulse and said empty signal being active;
generating a second signal in response to said second pulse and said empty-or-one signal being active;
generating a third signal in response to said first pulse, said empty signal being inactive and said empty-or-one signal being active;
generating a fourth signal in response to any of said first, second and third signals; and
propagating said incoming data to said output in response to said fourth signal.

38. The data access controller, as set forth in claim 37, further comprising the step of providing a reset signal in response to said fourth signal to stop generation of said second and third signals.

39. The data access controller, as set forth in claim 30, wherein said step of propagating data includes propagating said incoming data to said output in response to a control signal produced when the number of occurrences of said READ signals is equal to the number of occurrences of said WRITE signals.

40. The data access controller, as set forth in claim 30, wherein said step of propagating data includes propagating said incoming data to said output in response to a control signal produced when the number of occurrences of said WRITE signals exceeds the number of occurrences of said READ signals by one.

41. The data access controller, as set forth in claim 30, wherein said step of propagating data includes propagating data from said memory device to said output in response to a control signal produced when the number of occurrences of said WRITE signal exceeds the number of occurrences of said READ signals by at least two.

* * * * *